United States Patent [19]

Hoppal et al.

[11] Patent Number: 5,174,762

[45] Date of Patent: Dec. 29, 1992

[54] CIRCUIT BOARD ADAPTER FOR COMPUTER SYSTEM

[75] Inventors: John P. Hoppal; Arlen L. Roesner, both of Fort Collins, Colo.

[73] Assignee: Hewlett Packard Company, Palo Alto, Calif.

[21] Appl. No.: 786,436

[22] Filed: Nov. 1, 1991

[51] Int. Cl.⁵ .......................................... H01R 13/00
[52] U.S. Cl. ..................................................... 439/61
[58] Field of Search ...................... 439/59, 60, 61, 62, 439/64, 65, 629–637

[56] References Cited

U.S. PATENT DOCUMENTS

| | | | |
|---|---|---|---|
| 2,864,977 | 12/1958 | Witt et al. | 439/59 |
| 2,954,485 | 8/1960 | Buck | 439/59 |
| 3,736,471 | 5/1973 | Donze et al. | 439/59 |

Primary Examiner—Joseph H. McGlynn
Attorney, Agent, or Firm—Augustus W. Winfield

[57] ABSTRACT

A modular adapter assembly for installing circuit boards in a computer system. The adapter assembly, with an attached industry standard circuit board meeting ISA, EISA, or MicroChannel specifications, can be inserted into a computer system through an opening in the back of the computer. The adapter assembly permits insertion and removal of circuit boards without requiring removal of a major computer housing cover and without requiring removal of attached signal cables.

1 Claim, 4 Drawing Sheets

CIRCUIT BOARD ADAPTER FOR COMPUTER SYSTEM

FIELD OF INVENTION

This invention relates to electrical connection systems in computers. More particularly, the invention relates to systems for connecting optional circuit boards into a computer.

BACKGROUND OF THE INVENTION

Modern personal computers and workstations commonly have a system for adding additional circuit boards to the base system. These add-on circuit boards are available from many manufacturers, not just the computer manufacturers. There are three standards as follows for electrical and mechanical specifications for the most common personal computer add-on circuit boards:
1. Industry Standard Architecture (ISA). ISA circuit boards are compatible with the IBM PC, IBM PC/XT and IBM PC/AT personal computers developed by International Business Machines, Inc. and other personal computers compatible with those IBM computers.
2. Extended Industry Standard Architecture (EISA). The EISA architecture is a superset of ISA. EISA compatible computers will accept ISA circuit boards but EISA compatible computers have additional performance and features for circuit boards designed to take advantage of EISA.
3. MicroChannel Architecture. The MicroChannel Architecture is the design used by most of the IBM PS/2 family of computers.

There is a need in the computer industry for a host computer to be able to accept and use any of the readily available industry standard add-on circuit boards, regardless of the particular design of the host computer.

FIG. 1 illustrates a prior art circuit board compatible with EISA mechanical requirements. The circuit board 100 has edge connector fingers 102 for inserting into a connector. A sheet metal bracket 104 has a hole 106 for fastening to a computer with a screw (not illustrated).

FIG. 2 illustrates a typical prior art computer designed to accommodate industry standard add-on circuit boards such as the EISA circuit board illustrated in FIG. 1. A cover 202 has been separated from chassis 200 for visibility. The computer has a base system circuit board 204 (often called a "mother board") for interconnecting secondary circuit boards 100 (often called "daughter boards"). Daughter boards compatible with the above standards have electrical connecting fingers along one edge (as illustrated in FIG. 1) and the mother board has a compatible connector 206 (FIG. 2) for accepting the daughter board edge fingers. Metal bracket 104 is attached to a metal shelf 208 by a screw (not illustrated) through a bracket hole 106. The metal bracket 104 fills an opening in the back of the computer housing. The daughter board 100 may have connectors which protrude through the metal bracket 104 for external cables. To remove or insert a circuit board with edge connector fingers, the circuit board must be moved in the direction of the edge connector fingers, as illustrated by arrow 210 in FIG. 2. External cables must be removed to permit the metal bracket 104 and connectors to clear other parts of the computer enclosure. Insertion and removal of daughter boards also usually requires removal of a computer housing cover 202 as illustrated in FIG. 2. This usually requires removal of multiple cover fasteners. Removal of the computer cover 202 potentially exposes the user to hazardous voltages. Removal of the cover also exposes critical system components to potential damage from electrostatic discharge (ESD).

For many personal computer designs, the height of the computer housing must be greater than the length of the standard metal bracket for industry standard daughter boards. The computer cannot easily be made lower in height without sacrificing compatibility with many add-on daughter boards or without sacrificing ease of removal of add-on daughter boards.

Personal computer systems require insertion and removal of printed circuit boards, for service and repair and for installing different options to satisfy user needs. A need exists for a personal computer system with convenient and rapid insertion and removal of industry standard daughter boards without requiring removal of a housing cover. In addition, a need currently exists for maintaining mechanical compatibility with industry standard daughter boards while still allowing mechanical design flexibility in the host computer. In addition, a need exists for maintaining electronic compatibility with industry standard daughter boards while still allowing electronic design flexibility in the host computer.

SUMMARY OF THE INVENTION

The present invention improves computer system mechanical design by providing a convenient system for adding and removing circuit boards to the computer system without having to remove the entire cover for the computer system. The computer system in the present invention also provides a convenient system for adding circuit boards meeting one industry standard for physical dimensions and electrical connections into a computer system which requires a different standard for circuit board physical dimensions and electrical connections.

The present invention comprises a computer housing with openings in the back and an adapter assembly which can be inserted and removed through an opening in the back. The adapter assembly has an adapter circuit board which meets the electrical and physical requirements of the host computer system. The adapter assembly provides a additional connector which permits an optional circuit board to be mounted perpendicular to the adapter circuit board. The adapter circuit board provides circuitry to adapt the electrical signals required by the computer system to the electrical signals required by the option board. Mounting the option circuit board perpendicular to the adapter circuit board allows the physical dimensions of the option circuit board to be different than the physical dimensions of the host computer system boards. A metal plate provides radio frequency interference (RFI) protection, mechanical support for both the adapter circuit board and the optional circuit board and also serves as a portion of the back of the computer system. The entire assembly of adapter circuit board, optional circuit board and metal plate can be inserted or removed through the back of the computer system without removal of the computer system cover. External signal cables may remain attached during insertion and removal of the assembly.

DETAILED DESCRIPTION OF THE PREFERRED EMBODIMENT OF THE INVENTION

Figure 3:
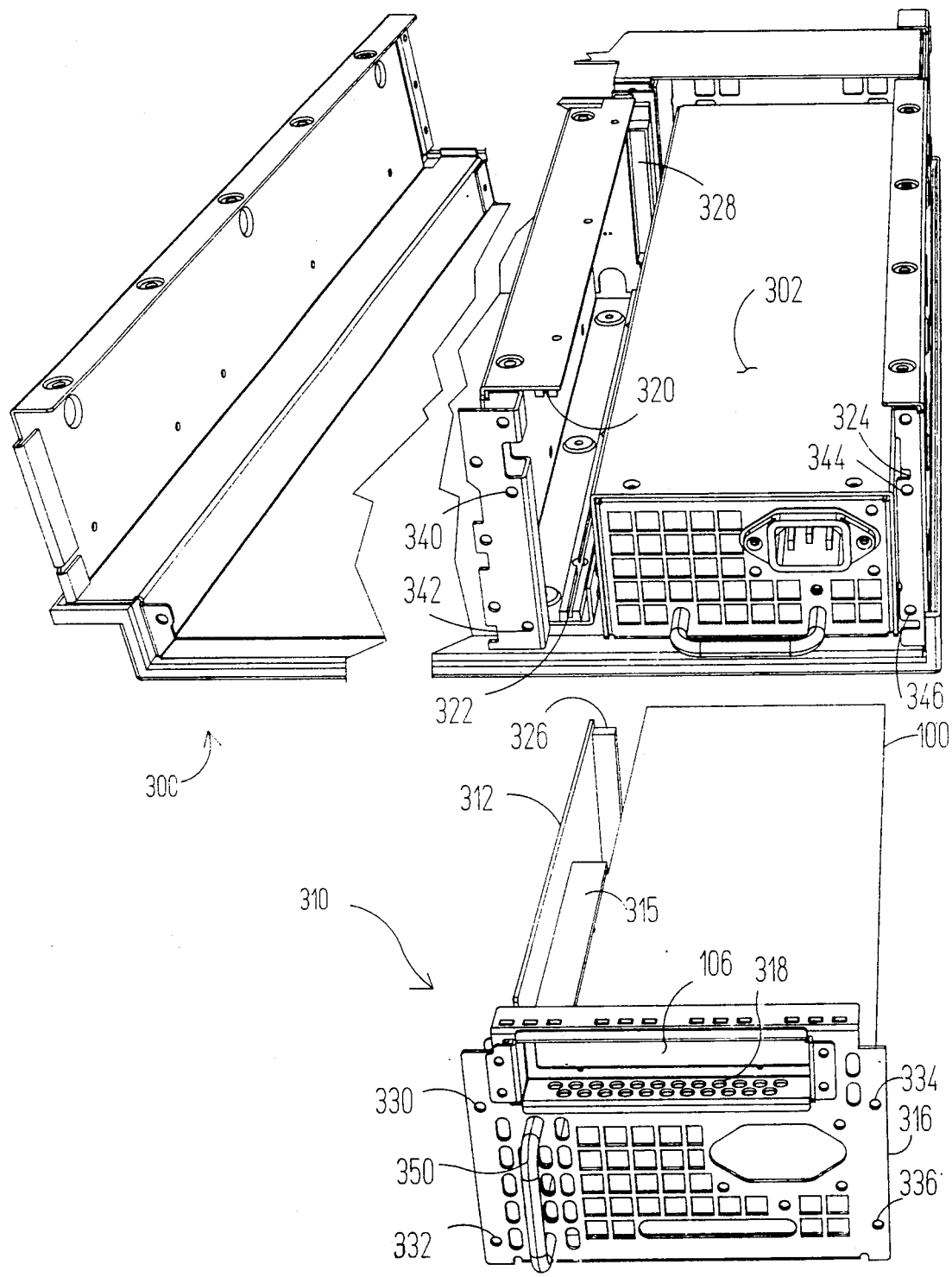
FIG. 3 is a mechanical perspective rear view illustrating a computer chassis and adapter assembly comprising the present invention.

FIG. 3 illustrates a mechanical perspective rear view of the chassis of the host computer system and the adapter assembly comprising the present invention. A chassis 300 provides a framework for mounting various components. A power supply 302 is mounted in one corner as shown.

Figure 1:
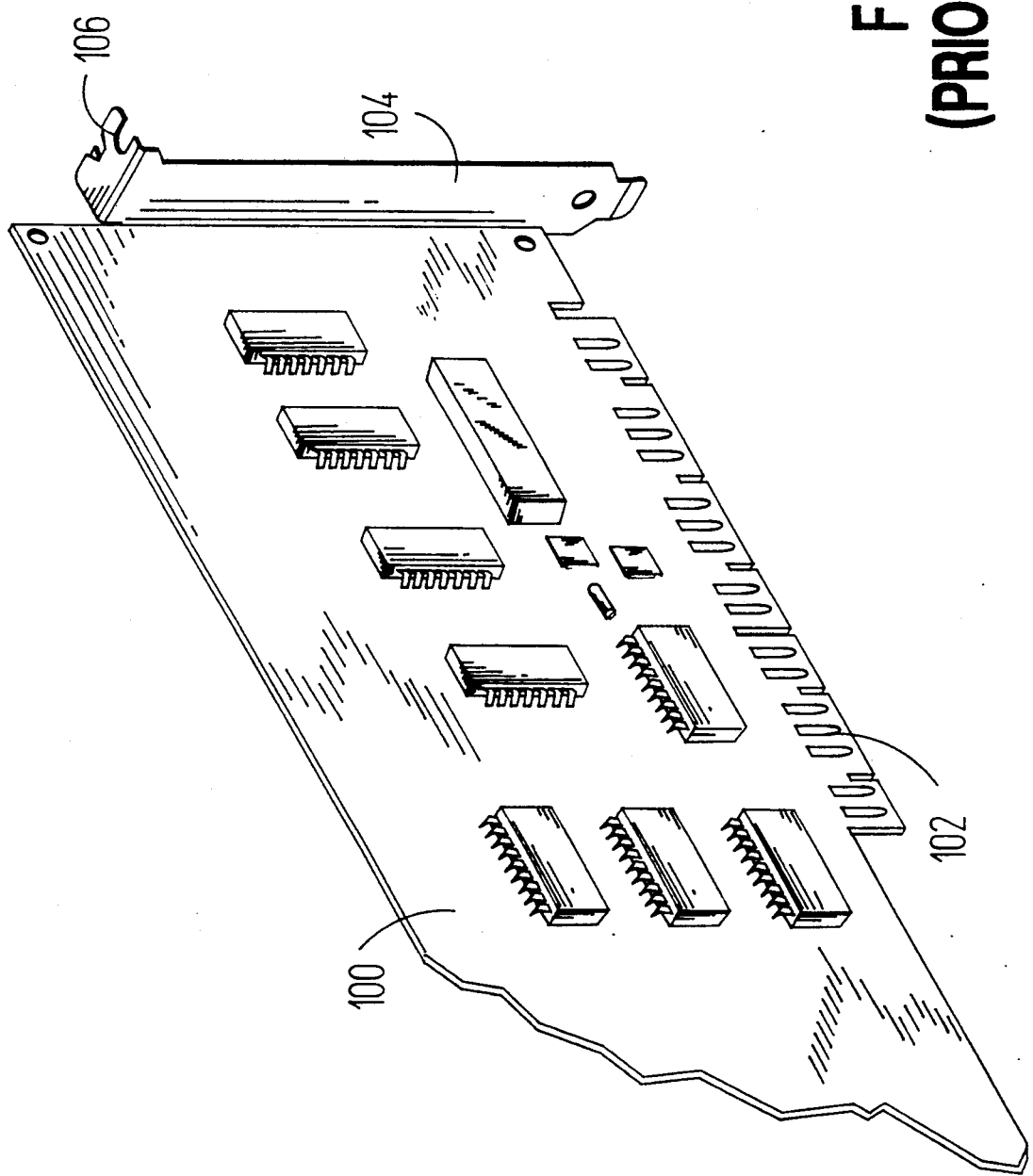
FIG. 1 is a mechanical perspective illustration of a circuit board compatible with the EISA standard (prior art).
Figure 2:
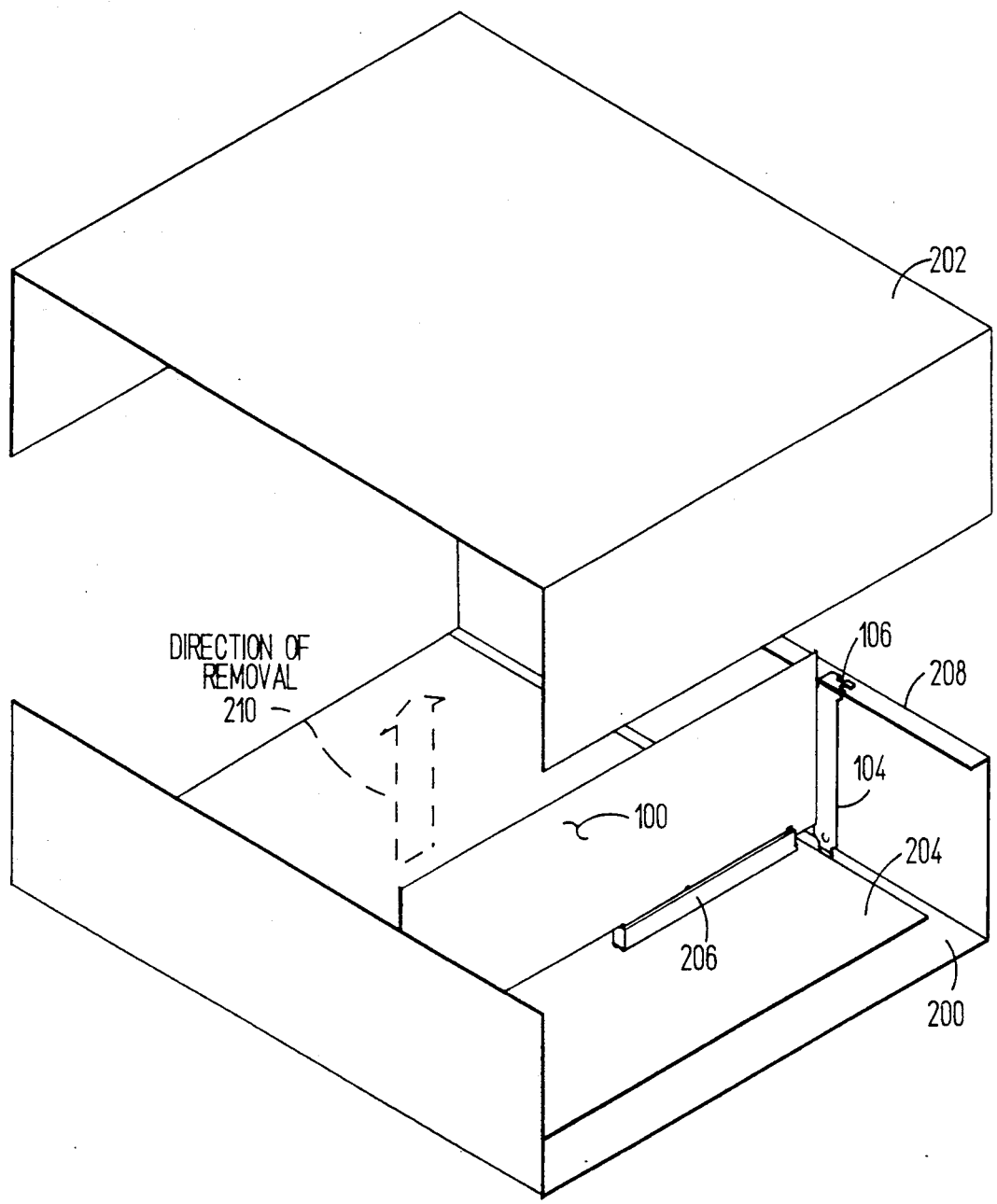
FIG. 2 is a mechanical perspective view illustrating a prior art host computer containing an add-on circuit board.

Continuing with FIG. 3, the adapter assembly 310 is comprised of an adapter circuit board 312, an option circuit board 100, and an adapter plate 316. The option circuit board 100 has edge connector fingers (as illustrated in FIG. 1) inserted into connector 315 which is mounted on adapter circuit board 312.

Continuing further with FIG. 3, the adapter plate 316 has a channel 318 protruding toward the option circuit board 100. The option circuit board 100 has a metal bracket 106 (as illustrated in FIG. 1) which is attached to the channel 318 and covers a hole in the channel 318.

As illustrated in FIG. 3, the adapter assembly 310 is inserted into the chassis 300 by guiding the adapter circuit board 312 edges into chassis circuit board guides 320, 322 and by guiding the option board 100 top edge into a notch 324 in the chassis 300. The adapter circuit board 312 has a connector 326 which mates with a corresponding chassis connector 328 when the adapter assembly 310 is fully inserted. When the adapter assembly 310 is fully inserted, the adapter plate 316 covers the power supply 302. The adapter plate is secured to the chassis 300 by four thumb screws (not illustrated) passing through the adapter plate mounting holes 330, 332, 334, 336 and into chassis mounting holes 340, 342, 344, 346. The adapter plate 316 provides mechanical support, suppression of radio frequency interference and serves as a cover for a portion of the back of the chassis 300. A handle 350 facilitates insertion and removal of the adapter assembly. The entire adapter assembly consisting of adapter circuit board 312, option circuit board 100 and adapter plate 316 can be inserted and removed through the rear of the chassis 300 without removal of any system covers and without removal of attached cables.

In the preferred embodiment as illustrated in FIG. 3, the adapter assembly 310 contains a single option circuit board 100. In other configurations, with the power supply mounted in a different location, adapter circuit board 312 may be designed with multiple connectors to hold multiple option circuit boards.

Figure 4:
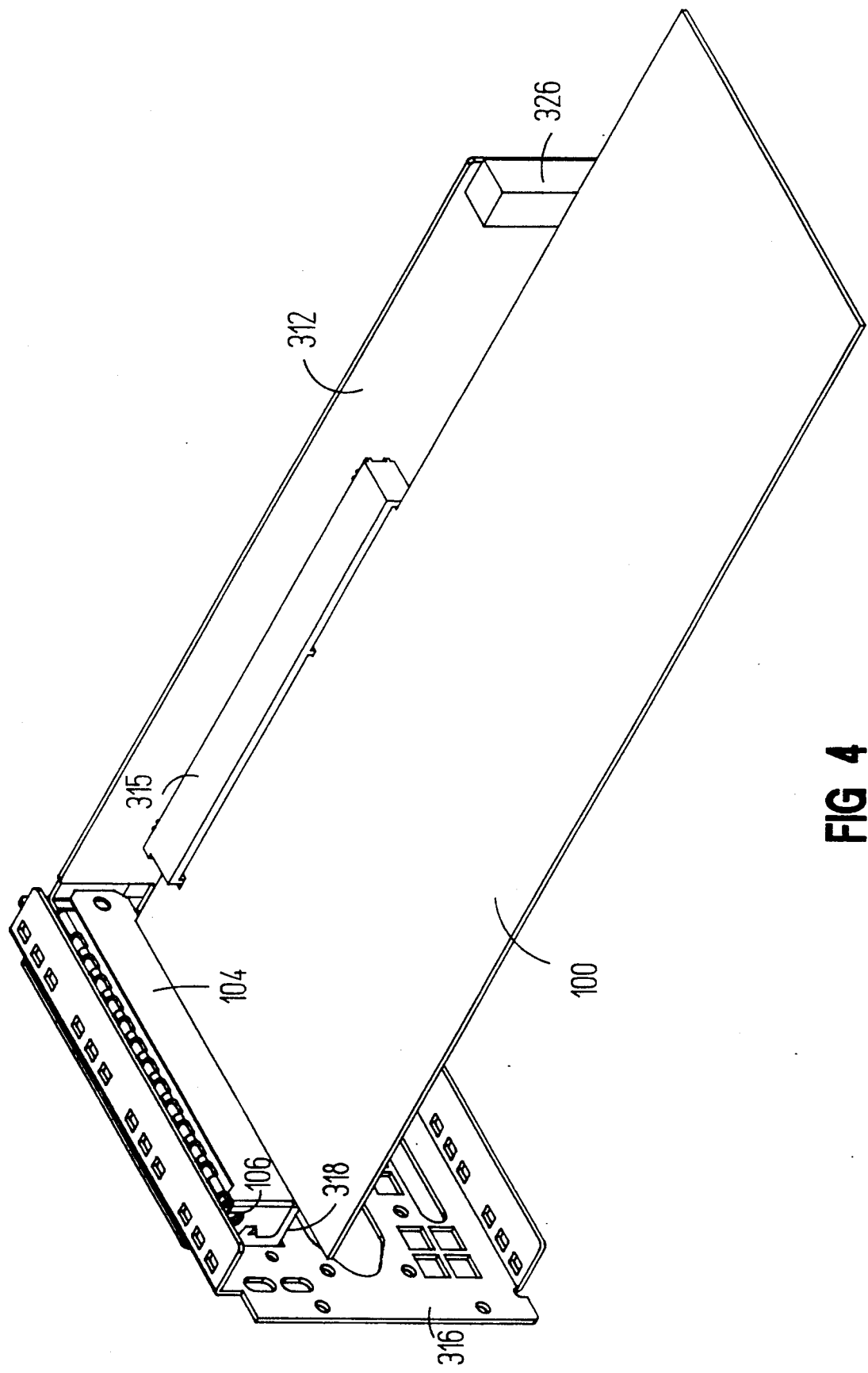
FIG. 4 is a mechanical perspective view of the adapter assembly illustrating additional detail.

FIG. 4 is a different perspective view of the adapter assembly 310. The adapter assembly main parts are adapter circuit board 312, option circuit board 100, and adapter plate 316. The option circuit board plugs into connector 315 which is attached to the adapter circuit board 312. Connector 326 provides electrical connection between the adapter circuit board 312 and the host computer. Adapter circuit board 312 contains circuitry necessary to translate host computer electrical signals and power as required at connector 326 to optional circuit board signals and power as required at connector 315.

In the preferred embodiment, the host computer is EISA compatible. Therefore, the adapter circuit board 312 only needs to provide passive electrical connections for optional circuit boards meeting the ISA or EISA standards. Optional circuit boards designed to meet the MicroChannel standard would require active signal translation by the adapter circuit board 312.

As illustrated in FIG. 4, option circuit board 100 is a circuit board corresponding to the Extended Industry Standard Architecture (EISA) standard for personal computers. Adapter circuit board 312 and adapter plate 316 as illustrated can accommodate any one EISA circuit board, such as for example, a network adapter circuit board or a peripheral I/O control circuit board.

As illustrated in FIG. 1, EISA compatible circuit boards have a metal bracket on one end which provides mechanical support. In FIG. 4, the metal bracket 104 is a standard EISA bracket attached to option circuit board 100. The metal bracket 104 (with any corresponding connectors) is accessible through an opening (hidden in FIG. 4), in the bottom of the channel 318. The metal bracket 104 is attached to an end of the channel 318 by a screw (not illustrated) through hole 106.

From the above description, it can be seen that the present invention improves computer system mechanical design by providing a convenient system for adding and removing circuit boards to the computer system without having to remove the entire cover for the computer system. The computer system in the present invention also provides a convenient system for adding circuit boards meeting one industry standard for physical dimensions and electrical connections into a computer system which requires a different standard for circuit board physical dimensions and electrical connections.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A structure for a computer system comprising a computer housing having a cover, and an adapter means for electrically and mechanically accommodating circuit boards within said computer housing, said adapter means being adapted to permit insertion of said adapter means into said computer housing and removal of said adapter means from said computer housing without requiring removal of said cover, to permit insertion and removal of said adapter means without requiring exposure of a user to high voltages, to permit insertion and removal of said adapter means without requiring exposure of an interior of said computer system to electrostatic discharge from said user, and to permit insertion and removal of said adapter means without requiring removal of an attached external signal cable, said adapter means further comprising:

option circuit board means, having a first board end and a first edge, with electrical connecting fingers along said first edge and a mounting bracket on said first board end, for providing optional additional computer functionality for said computer system;

adapter circuit board means, having an adapter/host connector and an adapter/option connector, said connecting fingers on said option circuit board inserted into said adapter/option connector, for adapting electrical signals required by said computer system to electrical signals required by said option circuit board means;

host connection means, electrically connected to said adapter/option connector, for electrically connecting said computer system and said adapter circuit board means;

said option board substantially perpendicular to said adapter circuit board and parallel to a bottom of said housing means, thereby permitting a height of said option board to be greater than a height of said housing means; and mounting plate means; covering an opening in a first side of said housing, mechanically attached to said mounting bracket of said option circuit board means and mechanically attached to said adapter circuit board means, adapted to permit said option circuit board means and said adapter circuit board means to be inserted and removed through said opening without removing said cover; for mechanically supporting said adapter circuit board means and said option circuit board means, and for preventing radio frequency interference through said opening.

* * * * *